US008638116B2

(12) United States Patent
Huang et al.

(10) Patent No.: US 8,638,116 B2
(45) Date of Patent: Jan. 28, 2014

(54) PROBE CARD HAVING CONFIGURABLE STRUCTURE FOR EXCHANGING OR SWAPPING ELECTRONIC COMPONENTS FOR IMPEDANCE MATCHING AND IMPEDANCE MATCHING METHOD THEREFORE

(75) Inventors: Chao-Ching Huang, Hsinchu Hsiang (TW); Chih-Hao Ho, Hsinchu Hsiang (TW); Wei-Cheng Ku, Hsinchu Hsiang (TW)

(73) Assignee: MPI Corporation, Chu-Pei, Hsinchu Hsiang (TW)

( * ) Notice: Subject to any disclaimer, the term of this patent is extended or adjusted under 35 U.S.C. 154(b) by 501 days.

(21) Appl. No.: 13/044,564

(22) Filed: Mar. 10, 2011

(65) Prior Publication Data

US 2011/0221462 A1    Sep. 15, 2011

(30) Foreign Application Priority Data

Mar. 11, 2010   (TW) .............................. 99107158 A

(51) Int. Cl.
*G01R 31/00* (2006.01)
(52) U.S. Cl.
USPC ............ 324/756.06; 324/750.16; 324/756.03; 324/756.02; 324/756.05

(58) Field of Classification Search
USPC .............. 324/750.01–750.19, 756.01–756.07
See application file for complete search history.

(56) References Cited

U.S. PATENT DOCUMENTS

| 5,801,541 | A | * | 9/1998 | Rezvani | 324/756.06 |
| 6,160,412 | A | * | 12/2000 | Martel et al. | 324/754.07 |
| 2011/0080187 | A1 | * | 4/2011 | Hotz et al. | 324/756.02 |

* cited by examiner

*Primary Examiner* — Jermele M Hollington
*Assistant Examiner* — Adam Clarke
(74) *Attorney, Agent, or Firm* — Ding Yu Tan

(57) ABSTRACT

A probe card having a configurable structure for exchanging/swapping electronic components for impedance matching and an impedance matching method therefore are provided. In the probe card, an applied force is exerted on the electronic component so as to make the electronic component electrically connected with at least one conductive contact pad of a supporting unit. The supporting unit is a circuit board or a space transformer. In order to facilitate the exchange or swap of the electronic component, the applied force can be removed. The probe card includes a pressing plate which can be moved between a pressing position and a non-pressing position. The pressing plate has a pressing surface which is contacted with the top end of the electronic component while the pressing plate is in the pressing position. Therefore, the applied force can be generated or removed by changing the positioning of the pressing plate.

3 Claims, 14 Drawing Sheets

PROBE CARD HAVING CONFIGURABLE STRUCTURE FOR EXCHANGING OR SWAPPING ELECTRONIC COMPONENTS FOR IMPEDANCE MATCHING AND IMPEDANCE MATCHING METHOD THEREFORE

FIELD OF INVENTION

The invention relates to a probe apparatus, and especially relates to a probe card having a configurable structure for exchanging electronic components for impedance matching, and an impedance matching method therefore.

BACKGROUND OF THE INVENTION

A probe card is used as a signal transmission interface between a tester and a device under test. In order to efficiently transmit high-frequency test signals, the impedance value of the probe card must be identical or similar to that of the tester and the device under test (DUT).

A plurality of known conventional methods is used to achieve the above purpose. For example, the quantity of conductive soldered joints in the probe card are changed that can make the impedance value of the probe card identical or similar to that of the tester and the DUT. As another example, the probe card with a plurality of coaxial probes can improve electrical transmission capacity by lowering the parasitic capacitance between the coaxial probes. In yet another example, the impedance value of the probe card is adjusted to be consistent with that of the tester and the DUT by exchanging/swapping electronic components with different impedance value.

The above described method could help in achieving the above purpose, but leave much to be desired. For instance, in the exchanging or swapping process of electronic components, the electronic component (e.g. an. inductor) is directly welded with the conductive contact pad so as to be electrically connected. Therefore, when the measured impedance value of the probe card is not close to that of the tester and the DUT, and is higher than a predetermined value, the solder must be removed before the electronic component is taken off, and followed by welding a new electronic component having a different impedance value on the probe card for completing the exchanging/swapping process of the electronic components.

However, in the operations for removing solder and for welding electronic component, the operational difficulties leads to the exchanging/swapping process to become more burdensome thereby lowering the efficiency of the electrical testing. In addition, in the process of mounting the new electronic component, the aligning of the tiny electronic component with the conductive contact pad on the printed circuit board is not an easy task, and thus making more difficult on the exchanging/swapping process. Furthermore, the electronic component is prone to be damaged during the solder removing and welding procedures. Therefore, due to the operational difficulties and the desire for efficient electrical testing, there is still room for improvement in matching the impedance value of the probe card with that of the tester and the DUT by exchanging/swapping the electronic components.

SUMMARY OF THE INVENTION

In view of the foregoing, it is the primary object of this invention to provide a probe card having a configurable structure for exchanging electronic components for impedance matching, and an impedance matching method therefore. As a result, the speed for exchanging or swapping the electronic component can be faster so as to improve the efficiency of the electrical testing.

To achieve the foregoing object, an impedance matching method for probe card is provided. The impedance matching method includes the following steps:

(a) providing a supporting unit for a probe card having a surface on which at least one conductive contact pad and at least one electronic component are mounted, and the electronic component is pressed by an applied force, and is electrically connected with the conductive contact pad, (b) mounting the probe card which contains the supporting unit described in step (a) between a tester and a device under test, (c) electrically testing an impedance value between the tester and the device under test through the probe card, and performing an exchanging/swapping process of the electronic component of probe card upon determining that the measured impedance value is not equal to a predetermined value, and the exchanging/swapping process of the electronic component comprising:

removing the applied force;

replacing the current electronic component from the supporting unit with another (new) electronic component having a different impedance value;

re-exerting the applied force on the new electronic component to ensure that the electronic component is electrically connected with the conductive contact pad;

(d) repeating step (c) until the measured impedance value being equal to the predetermined value.

To achieve the foregoing object, a probe card having a configurable structure for exchanging electronic components for impedance matching is provided for incorporation with the above-described method. The probe card includes a supporting unit, at least one electronic component, and a pressing device. The supporting unit has a surface which defines at least one mounting area, and at least one conductive contact pad is disposed in the mounting area. The electronic component is disposed in the mounting area and has a conductive end on the bottom. The pressing device is used for exerting an applied force so as to make the conductive end of the electronic component tightly contacted with the conductive contact pad of the supporting unit.

In the probe card, the pressing device comprises a pressing plate which is configured to be moved between a pressing position and a non-pressing position. The pressing plate has a pressing surface which is contacted with a top end of the electronic component while the pressing plate is in the pressing position. Because of the downwardly applied force, the electronic component is reliably electrically connected to the conductive contact pad.

In the probe card, a position alignment element is provided. The position alignment element has at least one opening which is aligned with the conductive contact pad, and is used for containing the electronic component. Because the electronic component can be aligned quickly with the conductive contact pad, the operational efficiency is improved.

In the probe card, at least one placement seat which is disposed on the supporting unit is provided. The placement seat has at least one hollowing portion that is corresponding to the mounting area. The pressing device has a pressing plate which is attached with the placement seat. In reference with respect to The pressing plate is configured to be moved between a pressing position and a non-pressing position in reference with respect to the placement seat. The pressing plate has a pressing surface which is contacted with a top end of the electronic component while the pressing plate is in the pressing position.

In the probe card, a stiffener, which is combined with the supporting unit, is provided. The stiffener is used to strengthen the rigidity of the supporting unit. Further more, the placement seat is joined with the stiffener.

The above and other aspects, features, and advantages of the present invention will become more apparent from the following detailed description when taken in conjunction with the accompanying drawings.

DETAILED DESCRIPTION OF THE INVENTION

Figure 1:
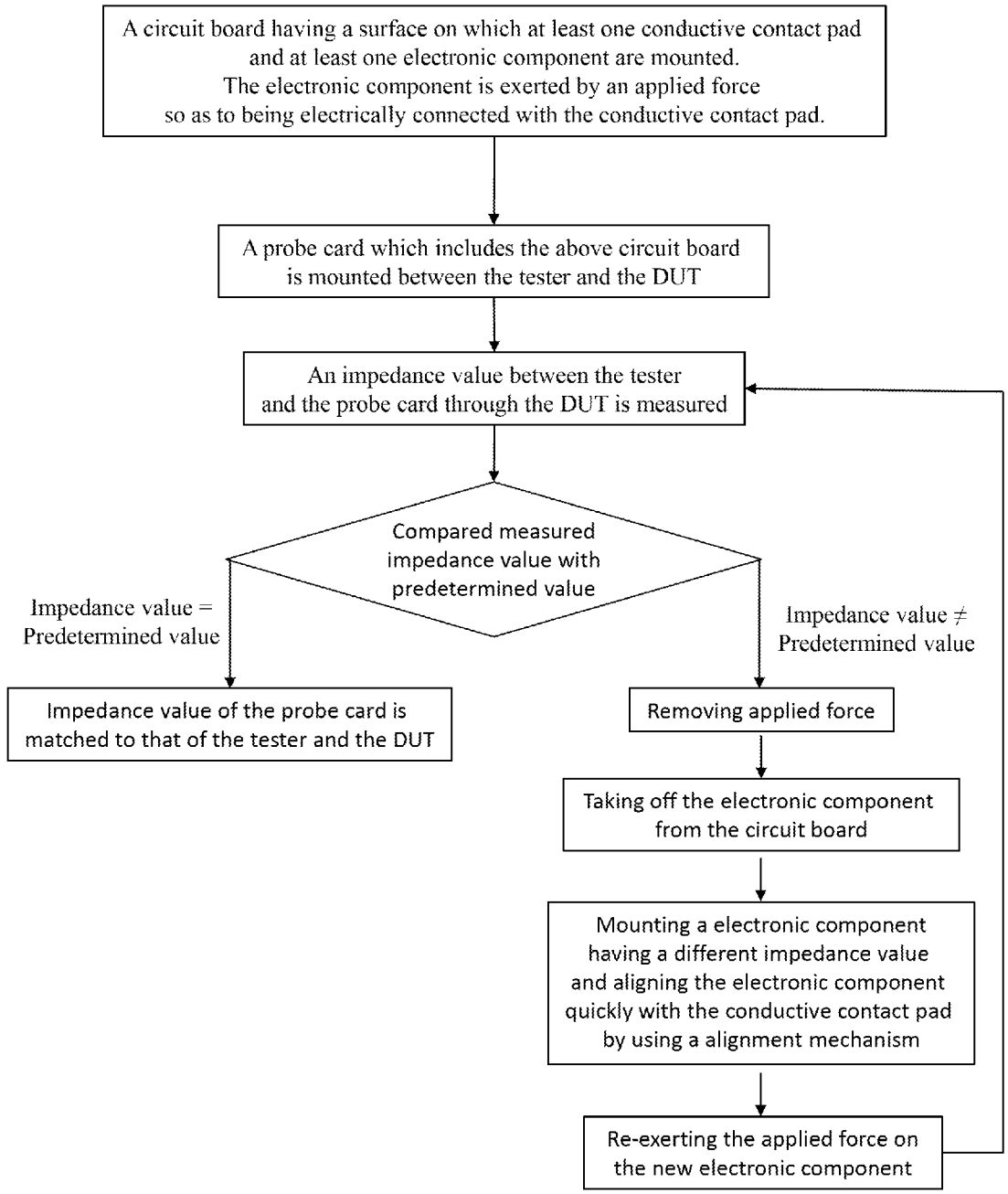
FIG. 1 shows a flow chart of the exchanging/swapping of the electronic components configured in the probe card.

The object of the invention is to ensure that the impedance value of a tester is consistent with that of a device under test (DUT). An exchanging/swapping process of the electronic components in the probe card is used in the method of the invention for achieving the foregoing object. Please refer to FIG. 1, the above-said method includes:

Step (a): a supporting unit having a surface on which at least one conductive contact pad and at least one electronic component are mounted. The supporting unit is a circuit board, for instance. An applied force is exerted on the electronic component so as to electrically connect the electronic component with the conductive contact pad.

Step (b): a probe card which includes the circuit board described in step (a) is mounted between the tester and the DUT.

Step (c): an impedance value between the tester and the DUT through the probe card is measured. As the measured impedance value is not equal to a predetermined value, an exchanging process of electronic components then takes place. The sequence of the exchanging process is as follows: (1) removing the applied force; (2) taking off the electronic component from the circuit board; (3) mounting a new electronic component having a different impedance value and aligning the new electronic component quickly with the conductive contact pad by using an alignment mechanism; (4) re-exerting the applied force on the new electronic component in order to ensure the new electronic component is electrically connected to the conductive contact pad of the circuit board. On the contrary, if the measured impedance value is equal to a predetermined value, the impedance value of the probe card is matched to that of the tester and the DUT.

Step (d): repeating step (c) until the measured impedance value being equal to the predetermined value.

The above description is related to the method of the invention. In order to further describe a probe card which is used in conjunction with the method of the invention and has a configurable structure for exchanging or swapping electronic components for impedance matching, several embodiments, taken in conjunction with the accompanying drawings, are described in the following description.

Figure 2:
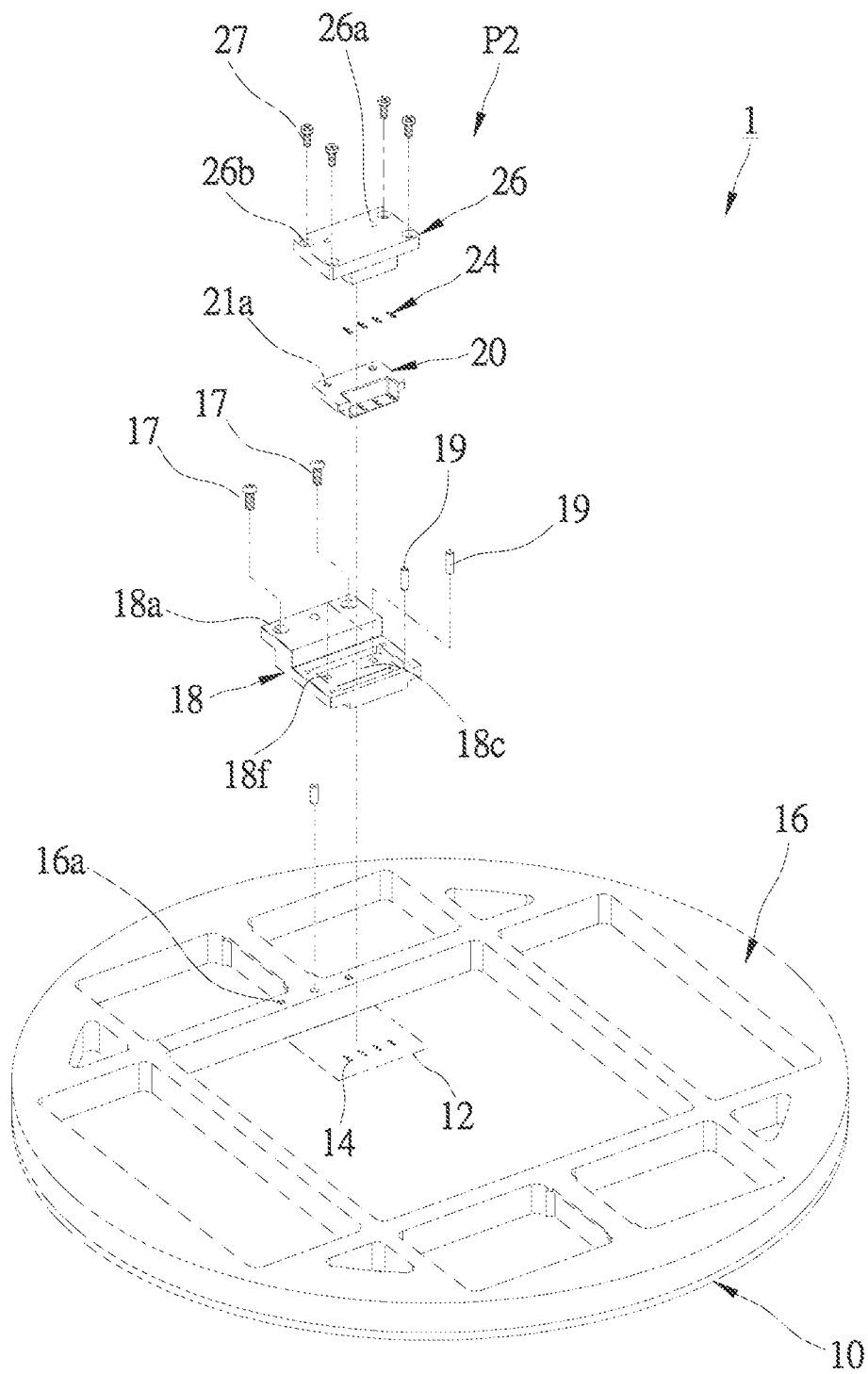
FIG. 2 shows an exploded view of the first embodiment in the invention.
Figure 3:
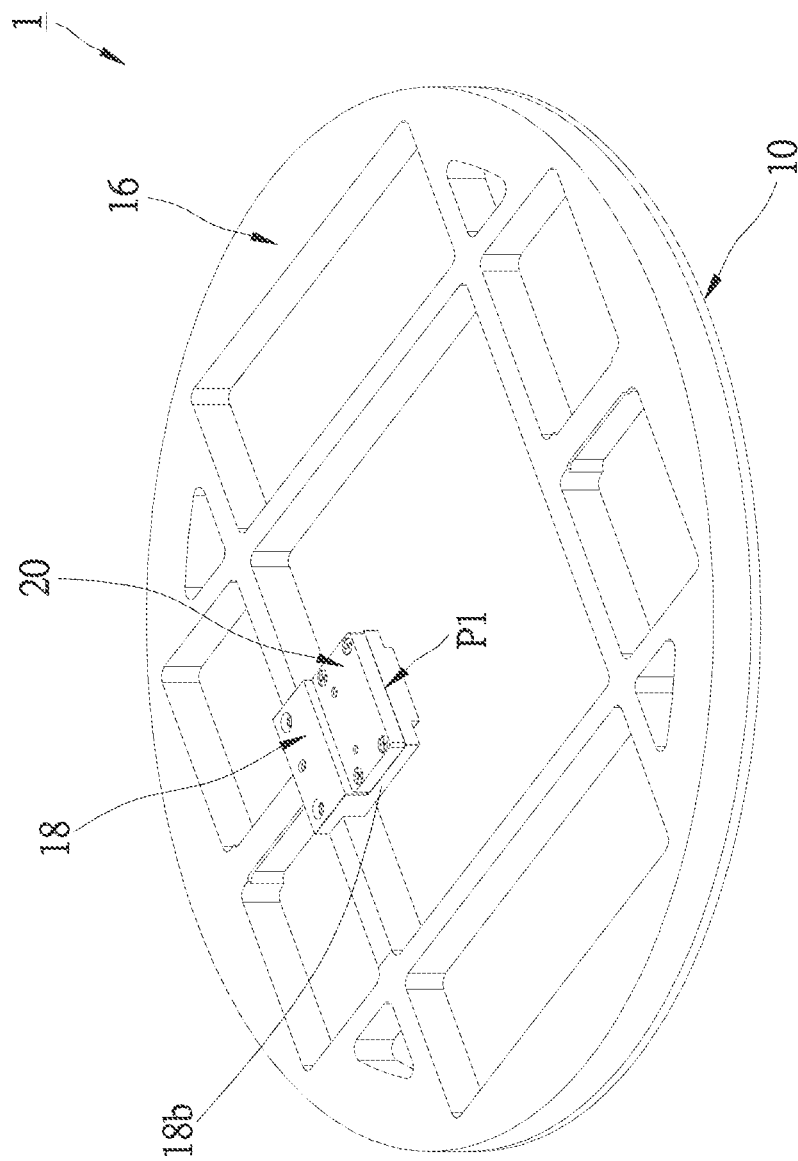
FIG. 3 shows a perspective view of the first embodiment in the invention.
Figure 4:
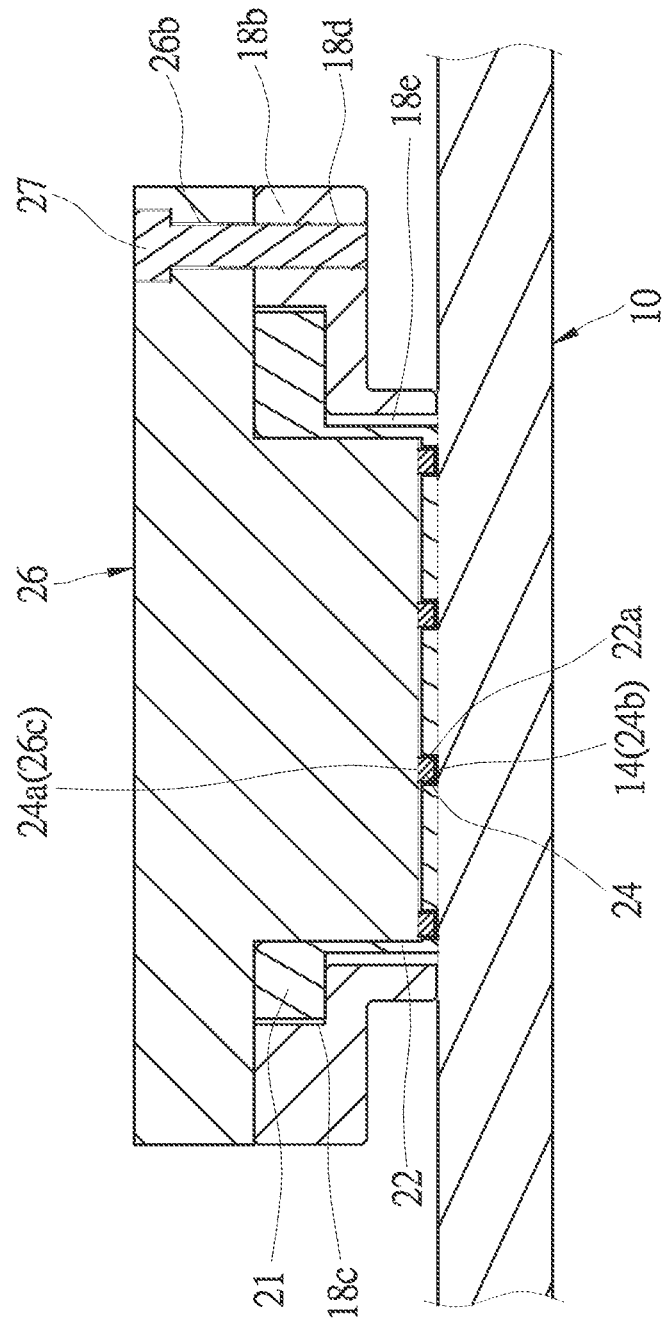
FIG. 4 shows a partial sectional view of the first embodiment in the invention.

Please refer to FIG. 2-FIG. 4, a probe card 1 of a first embodiment in the invention is shown. The probe card 1 includes a supporting unit such as a circuit board 10, a stiffener 16, a placement seat 18, a position alignment element 20, a plurality of electronic components 24, and a pressing device such as a pressing plate 26.

The circuit board 10 is a hard printed circuit board. In this embodiment, in reference with respect to a plurality of probe pins (not shown), a plurality of mounting areas 12 is defined in the reverse side of the circuit board. A plurality of conductive contact pads 14 is disposed on each of the mounting areas 12 according to particular usage requirement. The following described herein below includes only one mounting area 12 as an illustrative example.

The stiffener 16 is an annular bracket that is fixedly coupled with the circuit board 10 by a plurality of bolts, and is attached on the side of the circuit board 10 which has the mounting area 12. Because of the rigidity of the stiffener 16 thereof, the stiffener 16 can thereby support the circuit board 10 and enhance its flexural resistance. Furthermore, a plurality of threaded holes 16a is disposed on the stiffener 16.

Figure 5:
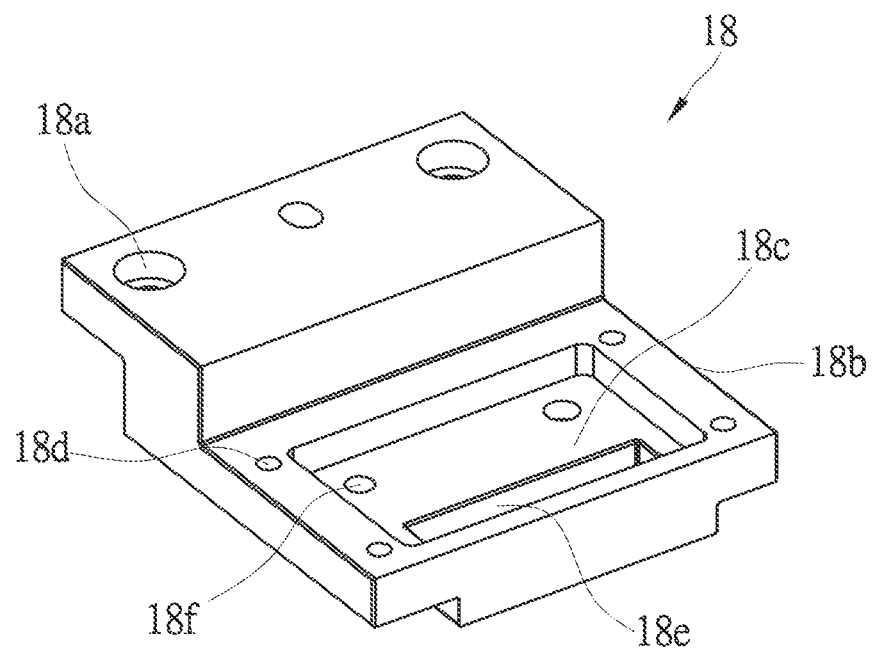
FIG. 5 shows a perspective view of the placement seat of the first embodiment in the invention.

The placement seat 18 is fixedly coupled with the stiffener 16 by penetrating two bolts 17 through the through holes 16a and locking the bolts 17 with the stiffener 16. Please refer to FIG. 5 which shows the placement seat 18 having a protrusion block 18b. A trough 18c and four threaded holes 18d are formed on the protrusion block 18b. The threaded holes 18d are distributed around the trough 18c, and formed as an alignment portion. A hollowing portion 18e and two threaded holes 18d are formed in the trough 18c. The hollowing portion 18e is passed through the protrusion block 18b and is corresponding to the mounting area 12. A plurality of alignment pins 19 is individually inserted into each inserting holes 18f, respectively.

Figure 6:
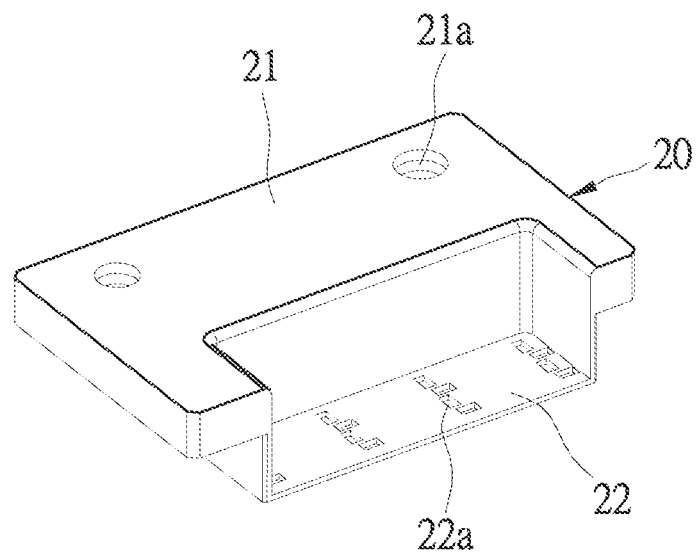
FIG. 6 shows a perspective view of the position alignment element of the first embodiment in the invention.

Please refer to FIG. 6. The position alignment element 20 includes a flat plate 21 and a sunken plate 22. Each alignment pin 19 formed on the flat plate 21 is aligned with and inserted through two positioning holes 21a respectively, so that the flat plate 21 can be reliably contained in the trough 18c of the placement seat 18. The sunken plate 22 is sunken into the hollowing portion 18e of the placement seat 18 when the flat plate 21 is joined with the trough 18c. Furthermore, the sunken plate 22 has a plurality of openings 22a. The position of the openings 22a is corresponding to that of the conductive contact pads 14 on the mounting area 12 of the circuit board 10.

In this embodiment, the electronic component 24 is, but not limited to, an inductor. The electronic component 24 has a top end 24a and a conductive end 24b on the bottom. As the electronic component 24 is moved into and disposed in the openings 22a of the position alignment element 20, the conductive end 24b of the electronic component 24 is aligned with the conductive contact pad 14 of the circuit board 10.

The pressing plate 26 has two position alignment holes 26a and four through holes 26b. The pressing plate 26 is aligned and assembled by aligning the position alignment holes 26a of the pressing plate 26 with the alignment pins 19 of the placement seat 18. Thereafter, four bolts 27 are each penetrated through the through holes 26b, respectively. The pressing plate 26 is fixedly joined with the placement seat 18 by locking one end of the bolts 27 into the threaded holes 18d of the placement seat 18, and the bolts 27 are formed as a connecting portion. At the same time, as the bolts 27 are locked tightly, the pressing surface 26c is pressed against the top ends 24a of the electronic components 24 (shown in FIG. 4) and exerts an applied force on the electronic components 24. As a result, the conductive ends 24b of the electronic components 24 are reliably contacted and electrically connected to the conductive contact pads 14 of the circuit board 10. The position of the pressing plate 26 under this condition is defined as a pressing position P1.

The above description is related to the probe card 1 of the first embodiment in the invention. The probe card 1 under the condition as shown in FIG. 3 is mounted between the tester and the DUT, and receives the test signals from the tester. If the measured impedance value is equal to the predetermined value, the impedance value of the probe card 1 is matched to that of the tester and the DUT. Thus, it is not necessary to exchange or swap the electronic components for altering or modifying the impedance value of the probe card 1.

If the measured impedance value is not equal to the predetermined value, the bolts 27 are released by a screw driver 27 and the pressing plate 26 are taken off. The position of the taken-off pressing plate 26 is defined as a non-pressing position P2 (shown in FIG. 2). After removing the applied force exerted on the electronic component 24, the electronic components 24 that are to be replaced are pick up by a tweezers, and properly collected. Then, a new electronic component having a different impedance value is mounted on. Because of the alignment mechanism provided by the openings 22a of the position alignment element 20, the new electronic component can be more quickly aligned with the conductive contact pad 14 of the circuit board 10. Thereafter, the pressing plate 26 is re-mounted on and joined with the placement seat 18 so as to make the new electronic component electrically connected with the circuit board 10. Thereafter, the impedance value between the tester and the DUT through the probe card 1 is measured, and the above-described steps in this paragraph are repeated until the measured impedance value is equal to the predetermined value.

From above, an ordinary person skilled in the art should recognize from the above embodiment that the solder removing and re-welding processes are not needed for exchanging/swapping the electronic components, whereupon the electrical connection between the electronic component 24 and the circuit board 10 is achieved instead by exerting applied force on the electronic component 24. Therefore, as a result, the electronic component 24 is not easily damaged and the speed for exchanging/swapping of the electronic components is increased, so that the efficiency of the electrical testing is thereby improved. In addition, due to the position alignment element 20 of the probe card 1, the new electronic components can be more quickly aligned with the conductive contact pads 14 of the circuit board 10, so that the exchanging/swapping efficiency is further improved.

Figure 7:
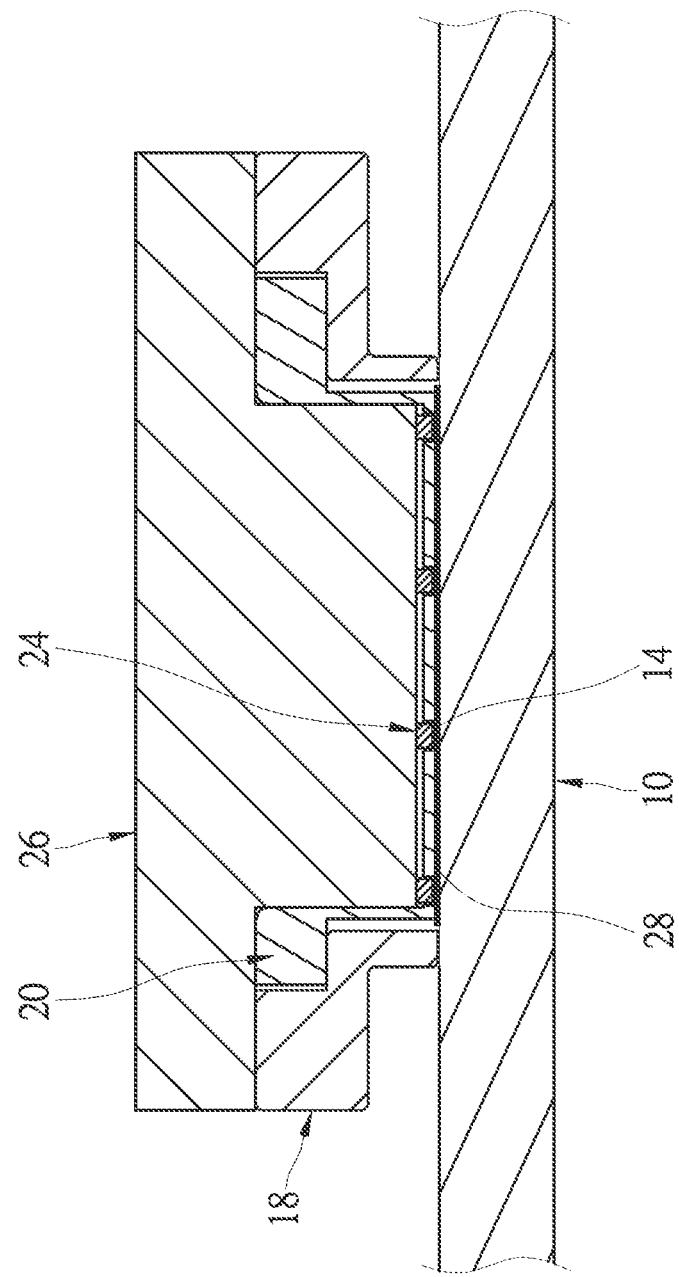
FIG. 7 is a partial sectional view which shows the anisotropic conductive paste being disposed between the electronic component and the circuit board.

Please refer to FIG. 7. In order to enhance the electrical conducting capability between the electronic components and the circuit board, another embodiment further includes a conductive sheet 28 disposed between the electronic component 24 and the conductive contact pads 14 of the circuit board 10. The conductive sheet 28, comprised of the anisotropic conductive paste or the like, is beneficial in electrically connecting the electronic components 24 with the circuit board 10 and protecting the electronic components 24 when the electronic components 24 are being removed.

Other embodiments of quickly exchanging/swapping the electronic components are described in the following.

Figure 8:
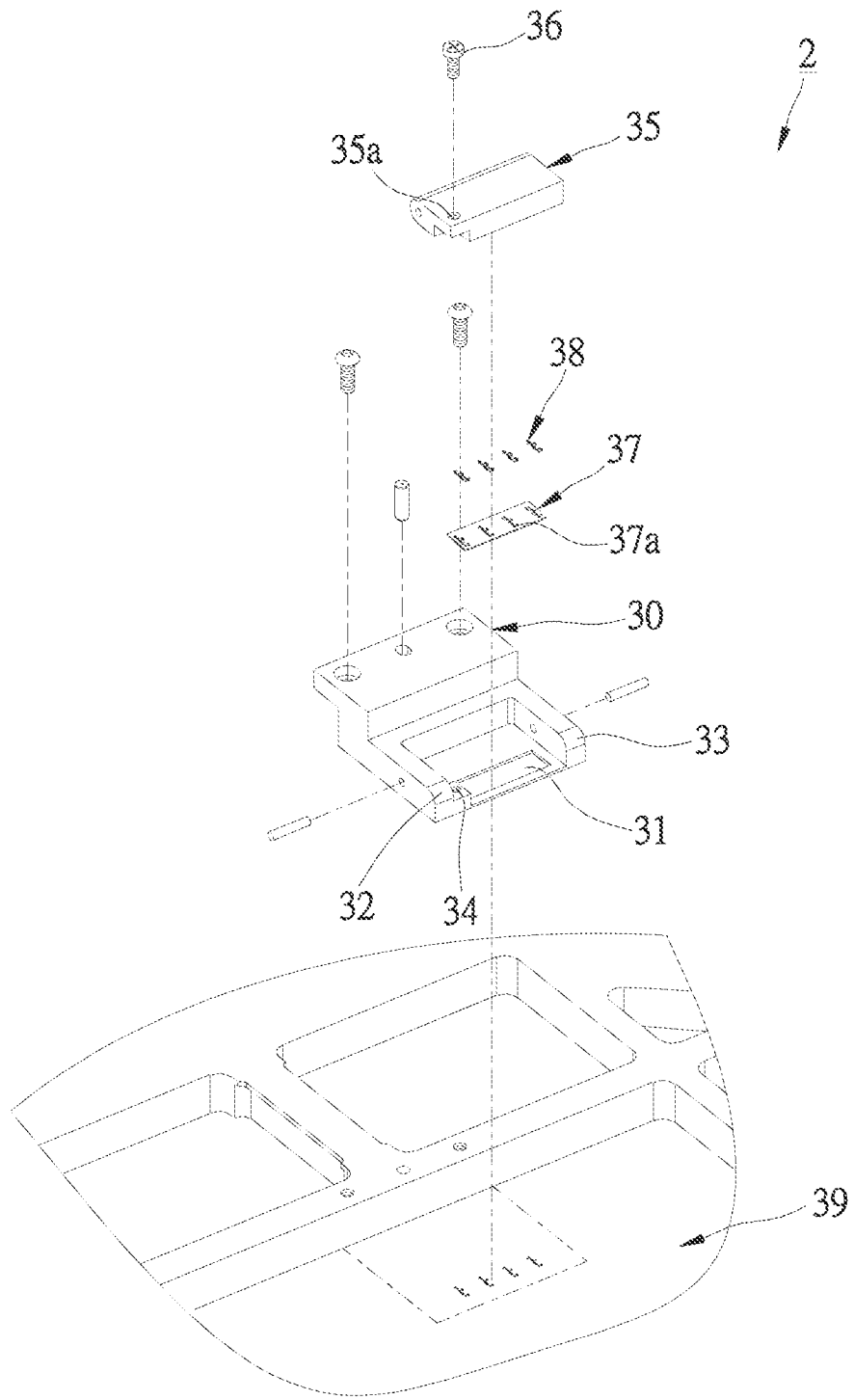
FIG. 8 shows an exploded view of the second embodiment in the invention.

FIG. 8 shows a probe card 2 of a second embodiment in the invention. The main differences between the probe card 2 of the second embodiment and the probe card 1 of the first embodiment are described in the following.

In the placement seat 30 of the probe card 2, a pivot ear 32 and a pivot ear 33 are disposed in the two sides of the hollowing portion 31, respectively. The alignment portion, comprised of a threaded hole 34, is disposed near the hollowing portion 31 of the placement seat 30. The pressing plate 35 is connected pivotally between the pivot ear 32 and the pivot ear 33, and can be moved between the pressing position P1 shown in FIG. 9 and the non-pressing position P2 shown in FIG. 10. Furthermore, a through hole 35a is formed in the pressing plate 35, and is used for insertion by a bolt 36. The pressing plate 35 is fixed in the pressing position P1 after locking the bolt 36 into the threaded hole 34 of the placement seat 30. The bolt 36 contributes to the connecting portion of the invention. Furthermore, in the present embodiment, a position alignment element 37 is opted to be disposed in the probe card 2. The position alignment element 37 is completely contained in the hollowing portion 31 and has a plurality of openings 37a to allow for quick alignment and containment of the electronic components 38.

Figure 9:
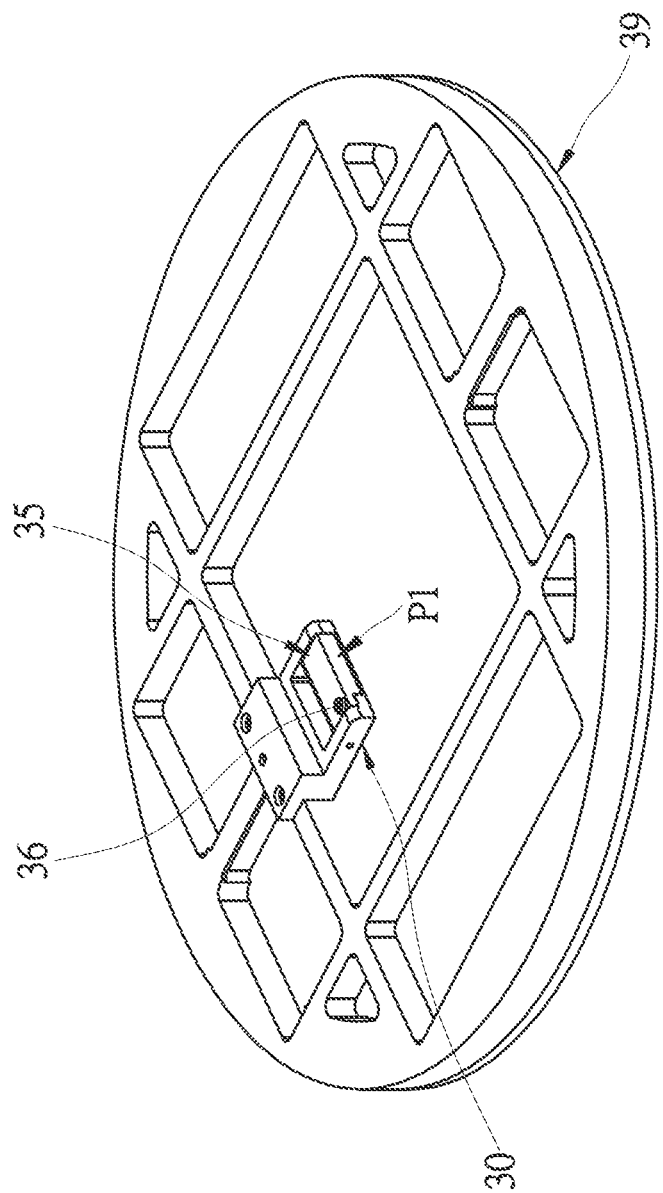
FIG. 9 is a perspective view of the second embodiment in the invention and shows the pressing plate is in the pressing position.
Figure 10:
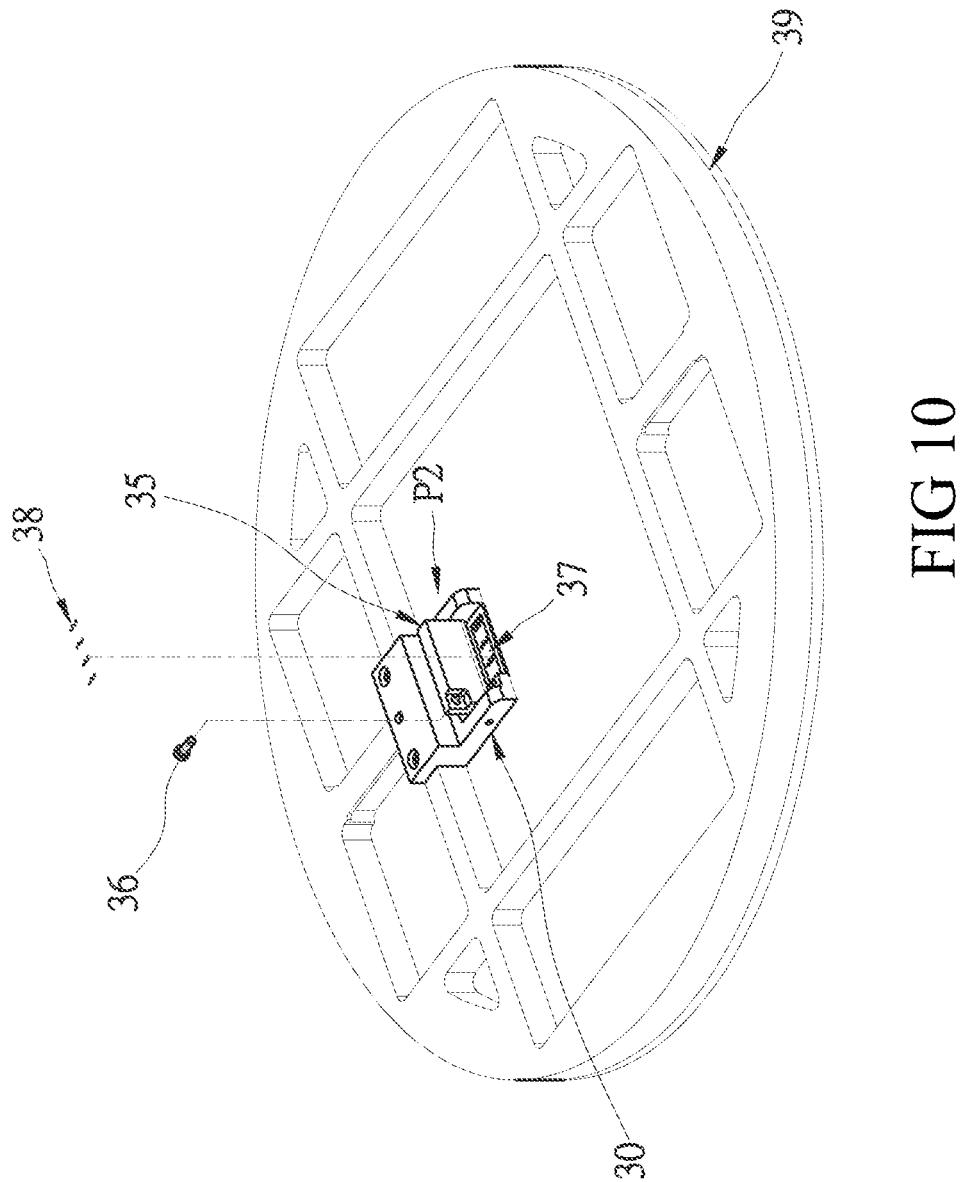
FIG. 10 is a perspective view of the second embodiment in the invention and shows the pressing plate is in the non-pressing position.

In the probe card 2 of the embodiment shown in FIG. 9, the electronic components 38 are pressed against the pressing plate 35 to ensure better electrical connection between the electronic component 38 and the circuit board 39. When the measured impedance value is not equal to the predetermined value, the user only needs to unscrew the bolt 36 and raise up the pressing plate 35 (as shown in FIG. 10), and then swap out the electronic components. Therefore, the probe card 2 in the embodiment also has the benefit of quick exchanging/swapping of the electronic components.

Although the placement seat is fixedly coupled with the stiffener in the first embodiment and the second embodiment, but it should be emphasized that the stiffener can be opted to be eliminated altogether, upon which the placement seat then can be directly locked into the circuit board.

Figure 11:
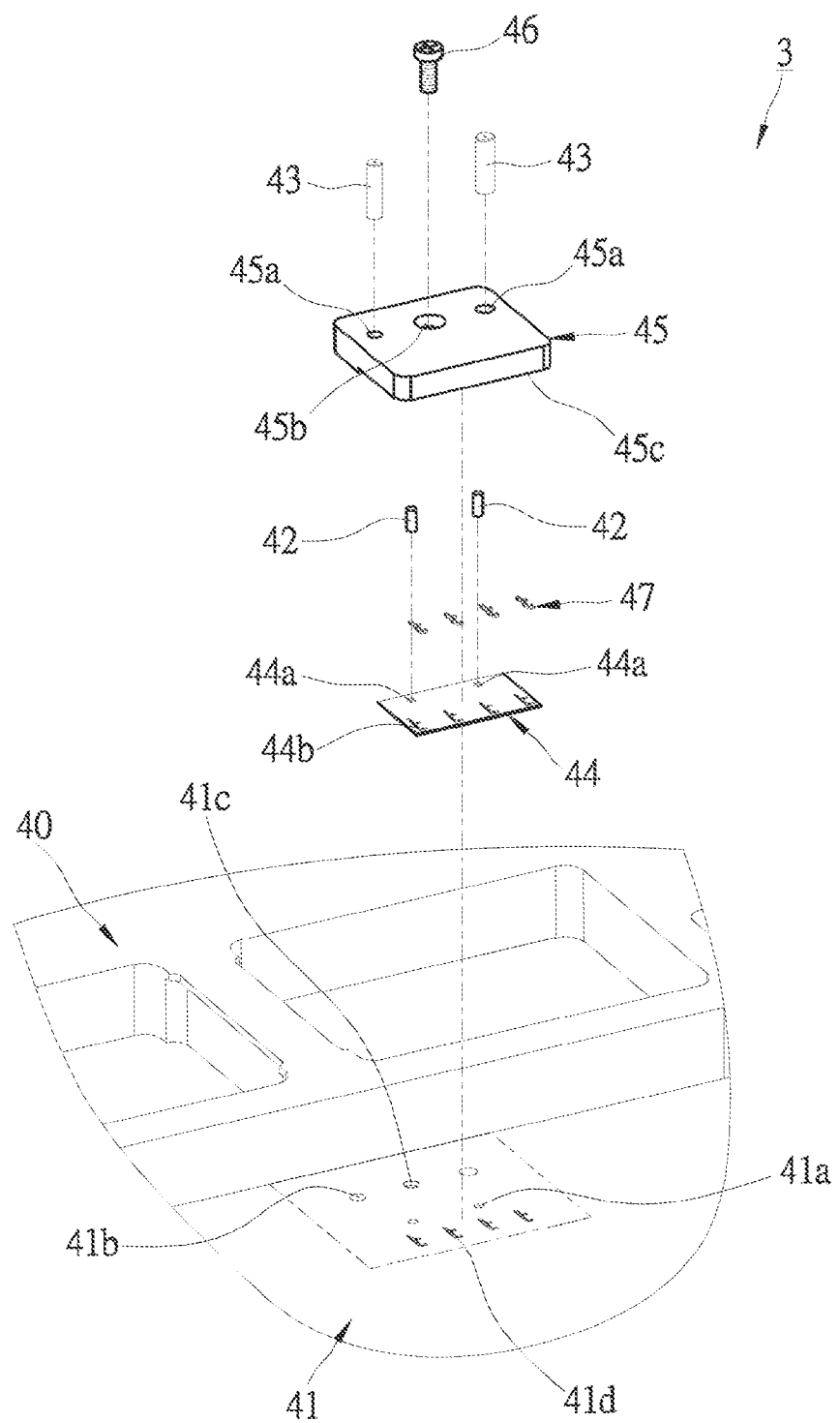
FIG. 11 shows an exploded view of a third embodiment in the invention.

FIG. 11 shows a probe card 3 of the third embodiment in the invention. In the probe card 3, a stiffener 40 is disposed, but the placement seat being similar to that shown in the first embodiment or the second embodiment, thus no further description are required. It should be emphasized that the stiffener 40 is only used to enhance the flexural resistance.

In the probe card 3 of the embodiment, two first coupling holes 41a, two second coupling holes 41b, and a threaded hole 41c are formed in the circuit board 41 and contributes as an alignment portion. The first coupling hole 41a is used for being inserted by a first positioning alignment element 42, and the second coupling hole 41b is used for being inserted by a second alignment element 42.

The position alignment element 44 is a plate having two through holes 44a and a plurality of openings 44b. The position alignment element 44 is connected with the circuit board 41 by engageably fitting the first positioning elements 42 in the through holes 44a. The openings 44b of the circuit board 41 are aligned with the conductive contact pads 41d.

The pressing plate 45 has two positioning holes 45a and a through hole 45b. The pressing plate 45 is pressed on the position alignment element 44 by fittingly engaging the second positioning element 43 in the positioning holes 45a. Then, a connecting portion comprised of a bolt 46 is penetrated through the through hole 45b and locked into the threaded hole 41c of the circuit board 41, so as to make the pressing plate 45 pressed tightly on the position alignment element 44. At the same time, a pressing surface 45c of the pressing plate 45 is contacted with the top end of the electronic component 47, so as to make the conductive ends on the bottom of the electronic components 47 electrically connected with the conductive contact pads 41d.

In the probe card 3, by the switching of the positioning of the pressing plate 45 between the pressing position and non-pressing position, the exchanging/swapping of the electronic components becomes easier. Furthermore, the position alignment element 44 is used for quicker alignment of the electronic components 47 with the conductive contact pads 41d. Therefore, the probe card 3 in the present embodiment also has the benefit of quicker exchanging/swapping of the electronic components.

Figure 12:
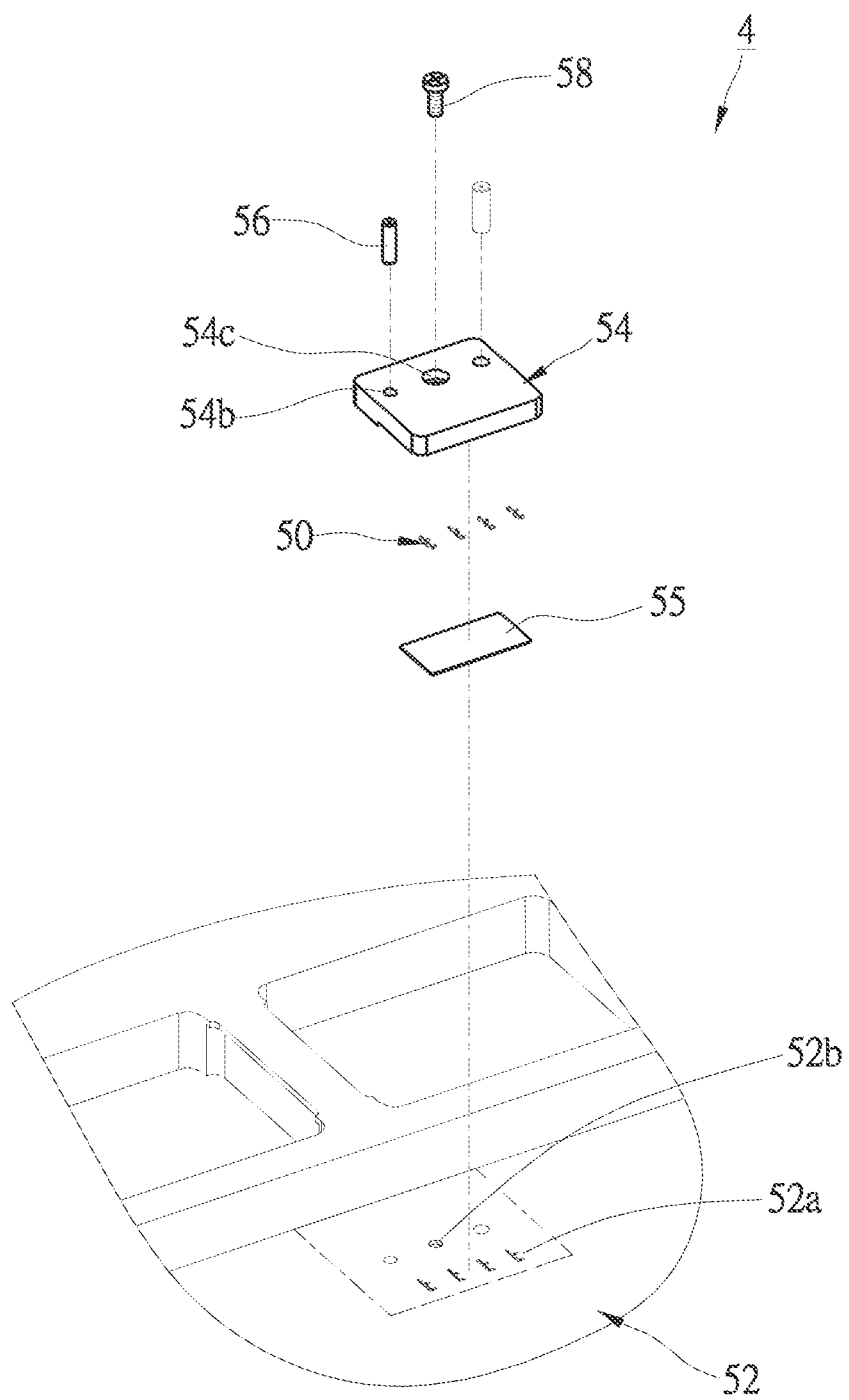
FIG. 12 shows an exploded view of a fourth embodiment in the invention.

FIG. 12 shows a probe card 4 of a fourth embodiment in the invention. The main difference between the probe card 4 and the probe cards in the first to third embodiments is that the position alignment element is not included in the probe card 4.

Figure 13:
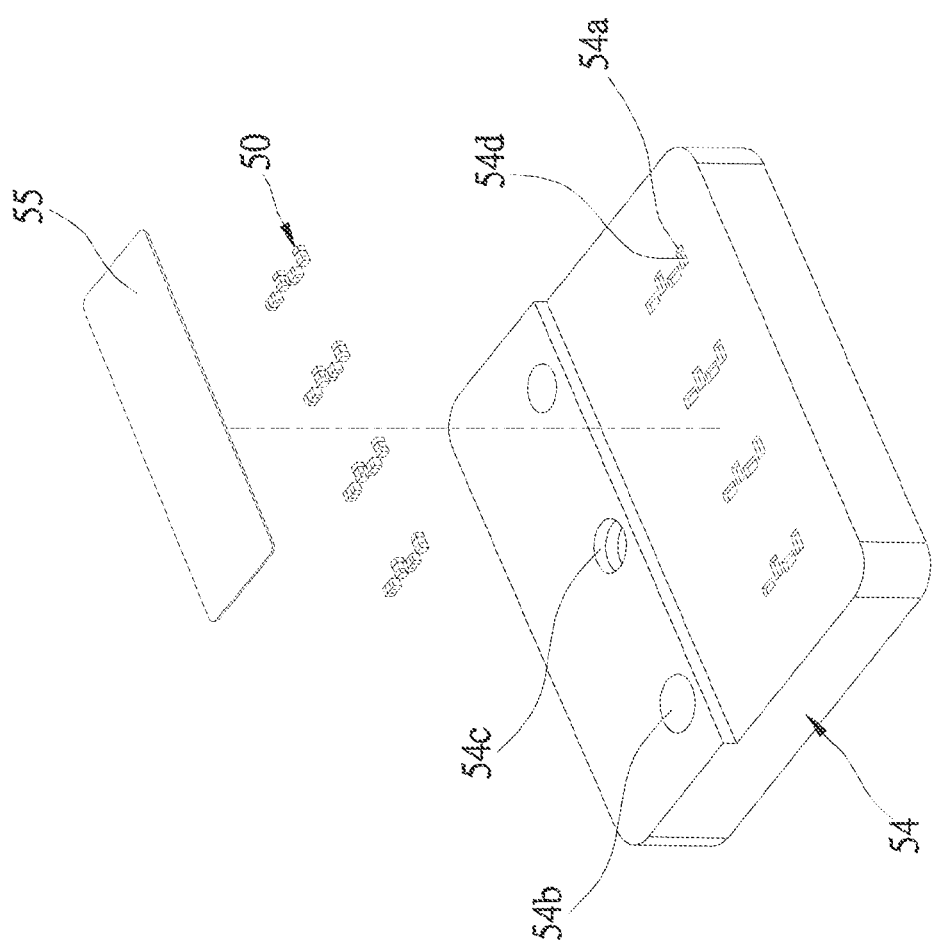
FIG. 13 shows the pressing plate, the electronic component, and the conductive sheet of the fourth embodiment in the invention.

As shown in FIG. 13, a plurality of alignment troughs 54a is formed in the side of the pressing plate 54, so that a plurality of electronic components 50 can each be quickly aligned with a plurality of electronic contact pads 52a in the circuit board 52, respectively. After each of the electronic components 50 is put in the alignment troughs 54a respectively, the conductive sheet 55 is fixed on the pressing plate 54, so that the electronic components 50 can be reliably disposed in the alignment troughs 54a. Then, the pressing plate 54 is turned over so that the alignment troughs 54b are aligned with the alignment pins 56 which are inserted into the circuit board 52. Furthermore, a bolt 58 is penetrated through a through hole 54c and locked into a threaded hole 52b of the circuit board 52. Thus, a pressing surface 54d which is formed on the inner surface of the alignment troughs 54a is pressed tightly against the top ends of the electronic components 50, and the conductive ends on the bottom of the electronic components 50 are firmly electrically connected to a plurality of conductive contact pads 52a of the circuit board 52, respectively.

Figure 14:
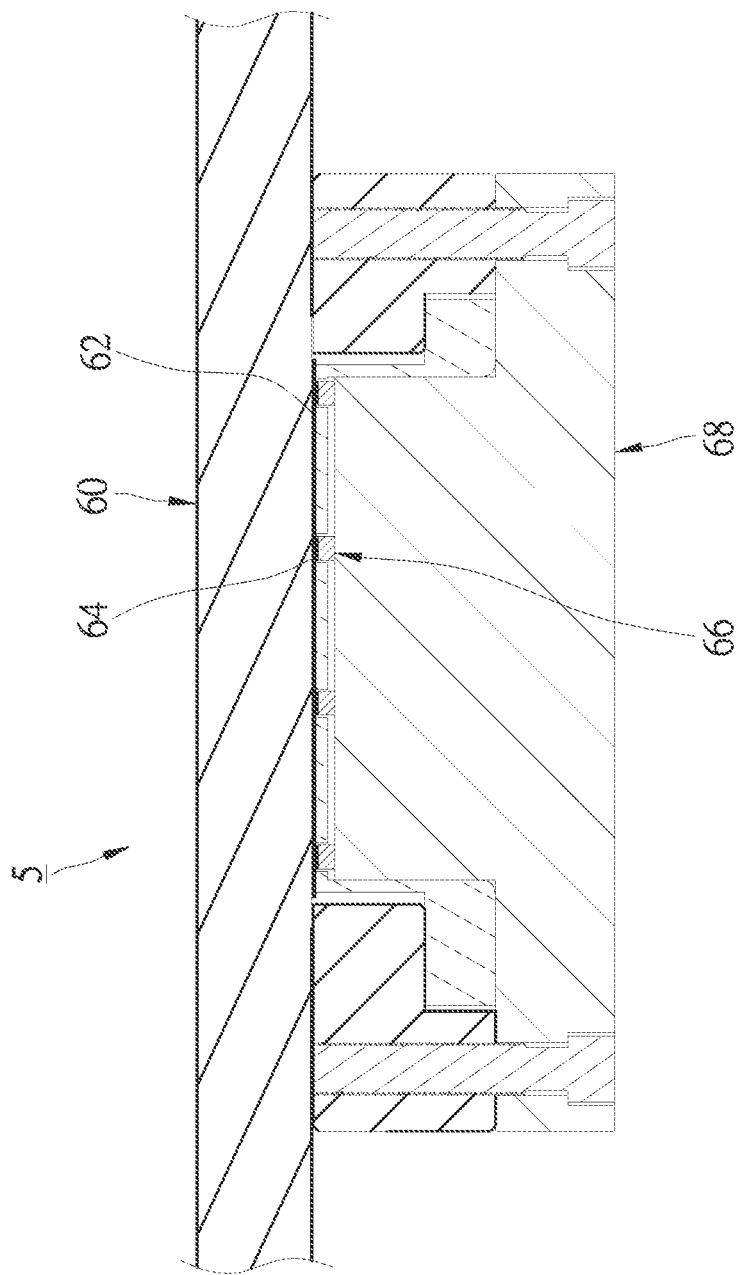
FIG. 14 shows a sectional view of a fifth embodiment in the invention.

FIG. 14 shows a probe card 5 of a fifth embodiment in the invention. The difference between the probe card 5 and those other probe cards in the first embodiment to the fourth embodiment is that a mounting area 62 of the circuit board 60 of the probe card 5 is defined in a side of the circuit board 60 in which a plurality of probe pins (not shown) is disposed. In addition, a plurality of conductive contact pads 64 is disposed in the mounting area 62. In other words, a plurality of electronic components 66 and a pressing device, such as a pressing plate 68, are disposed in the bottom side of the circuit board 60.

The assembled structure of the present embodiment is similar to the probe card 1 in the first embodiment, but illustrates that the technical features of the exchanging/swapping of the electronic components can be applicable in various conditions, so that the selection and adopting of the exchanging/swapping of the electronic components can be realized according to the particular requirements as needed.

Figure 15:
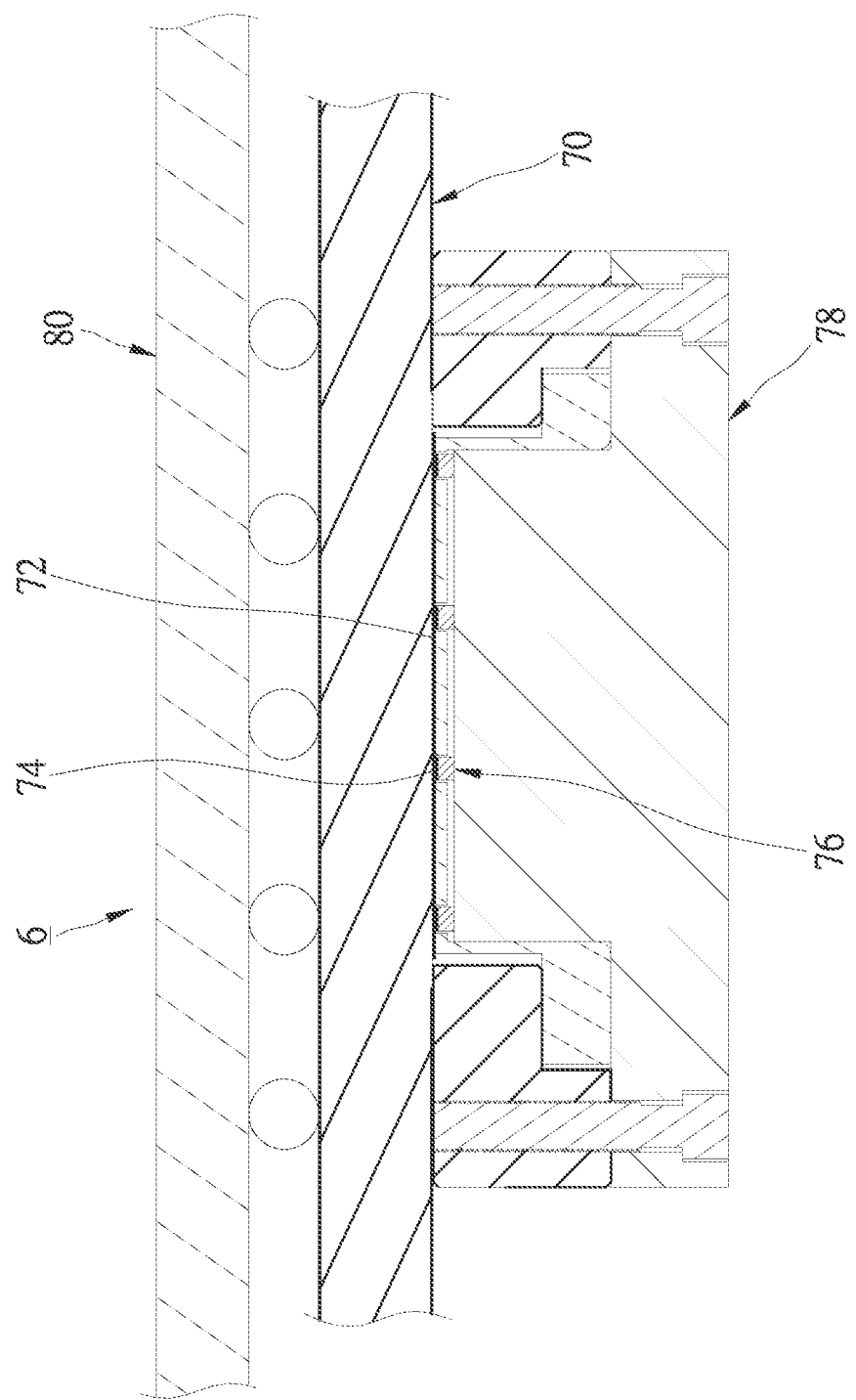
FIG. 15 shows a sectional view of a sixth embodiment in the invention.

FIG. 15 shows a probe card 6 of a sixth embodiment in the invention. The main difference between the probe card 6 and those other probe cards in the first to the fifth embodiment is that the supporting unit of the probe card 6 in the embodiment is a space transformer 70. The space transformer 70 is electrically connected with the bottom side of a circuit board 80, and is used to change the electrical transmission path, so that a layout pattern of the probe pins becomes more flexible. In the embodiment, a mounting area 72 is formed on the bottom area of the space transformer 70 and a plurality of conductive pads 74 is disposed in the mounting area 72. The electronic components 76 and the pressing plate 78 are mounted on the mounting area 72 of the space transformer 70 in a similar method as the embodiment shown in FIG. 14. The electronic components 76 are firmly electrically connected with the conductive pads 74 because of the pressing force applied from the pressing plate 78.

It should be emphasized that the method for quicker alignment of the electronic components involving the use of the alignment troughs which are formed in the surface of the pressing plate and aligned with the conductive contact pads of the circuit board is not only applicable in the probe card 4 of the fourth embodiment, but also can be applicable in the first to third embodiment, the fifth embodiment, and the sixth embodiment by only requiring to remove the position alignment element.

It should also be emphasized that the method of disposing the conductive sheet or the like between the electronic components and the conductive contact pads of the supporting unit for benefiting electrical connection can also be applicable in the other embodiments.

Although the description above contains many specifics, these are merely provided to illustrate the invention and should not be construed as limitations of the invention's scope. Thus it will be apparent to those skilled, in the art that various modifications and variations can be made in the system and processes of the present invention without departing from the spirit or scope of the invention.

What is claimed is:

1. The impedance matching method for probe card, used to ensure that an impedance of a tester is consistent with that of a device under test, the impedance matching method comprising the following steps:

(a) providing a supporting unit for the probe card, the supporting unit having a surface on which at least one conductive contact pad and at least one electronic component are mounted, and the electronic component pressed by an applied force and electrically connected with the conductive contact pad;

(b) mounting the probe card which contains the supporting unit described in step (a) between the tester and the device under test;

(c) electrically testing an impedance value between the tester and the device under test through the probe card, and performing an exchanging process of the electronic component of probe card upon determining that the measured impedance value is not equal to a predetermined value, and the exchanging process of the electronic component comprising:

removing the applied force;

replacing the current electronic component from the supporting unit with another new electronic component having a different impedance value;

re-exerting the applied force on the new electronic component to ensure that the electronic component is electrically connected with the conductive contact pad;

(d) repeating the step (c) until the measured impedance value being equal to the predetermined value.

2. The impedance matching method of claim 1, wherein in step (a) an alignment mechanism is provided for quick alignment of the electronic component with the conductive contact pad, and a pressing plate is provided for exerting the applied force.

3. The impedance matching method of claim 2, wherein the alignment mechanism comprises providing a position alignment element, the position alignment element has at least one opening which is corresponding to the conductive contact pad of the supporting unit, and the position alignment element is not removed in step (c) of the exchanging process of the electronic component.

* * * * *